United States Patent [19]

Hochberg et al.

[11] Patent Number: 5,013,690
[45] Date of Patent: May 7, 1991

[54] METHOD FOR DEPOSITION OF SILICON FILMS FROM AZIDOSILANE SOURCES

[75] Inventors: Arthur K. Hochberg, Solana Beach; David L. O'Meara, Oceanside; David A. Roberts, Carlsbad, all of Calif.

[73] Assignee: Air Products and Chemicals, Inc., Allentown, Pa.

[21] Appl. No.: 473,546

[22] Filed: Feb. 1, 1990

[51] Int. Cl.$^5$ .............................. H01L 21/469
[52] U.S. Cl. ........................ 437/233; 427/51; 148/DIG. 122
[58] Field of Search .............. 437/233; 427/51; 148/DIG. 122

[56] References Cited

U.S. PATENT DOCUMENTS

| | | | |
|---|---|---|---|
| 4,158,717 | 6/1979 | Nelson | 437/241 |
| 4,569,855 | 2/1986 | Matsuda et al. | 437/233 |
| 4,963,506 | 10/1990 | Liaw et al. | 437/233 |

Primary Examiner—Brian E. Hearn
Assistant Examiner—Trung Dang
Attorney, Agent, or Firm—James C. Simmons; William F. Marsh

[57] ABSTRACT

A low temperature chemical vapor deposition process comprising heating in a chemical vapor depositon reactor a substrate upon which deposition is desired to a temperature of from about 550° C. to about 750° C. in a chemical vapor deposition reactor having a pressure of from about 0.1 torr to approximately atmospheric pressure, introducing into the reactor a silicon-containing feed and optionally an oxygen containing feed, said silicon containing feed consisting essentially of one or more compounds having the general formula

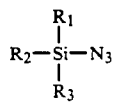

wherein: $R_1$, $R_2$, $R_3$ and $R_4$ are hydrogen, azido or C-2 to C-6 alkyl, aryl or C-7 to C-10 aralkyl groups, at least one but not more than three of $R_1$, $R_2$, $R_3$ and $R_4$, being azido, and maintaining the temperature and pressure to cause a film of silicon nitride, silicon oxynitride or silicon dioxide to deposit is disclosed.

9 Claims, No Drawings

METHOD FOR DEPOSITION OF SILICON FILMS FROM AZIDOSILANE SOURCES

FIELD OF THE INVENTION

This invention relates to the manufacture of semiconductor devices and, specifically, to the deposition of silicon films, with particular application in the manufacture of semiconductor devices, but not limited thereto.

BACKGROUND OF THE INVENTION

The general principles underlying the formation of thin films are described in HANDBOOK OF THIN FILM TECHNOLOGY, Maissell, Leon I. and Glang, Reinhard, editors, McGraw Hill Book Company, New York, 1970, and the general technology for processing silicon-based semiconductor devices in described in SILICON PROCESSING FOR THE VLSI ERA, Wolf, Stanley, and Talbert, Richard N., eidtors, Lattice Press, Sunset Beach, Calif., 1986, which includes a discussion of thin film technology.

The chemistry of silanes is described by Arkles, B., Peterson, W. R., Jr., KIRK-OTHMER ENCYCLOPEDIA OF CHEMICAL TECHNOLOGY, 3rd ed. Vol 20. 887–911. Silanes, also referred to as silicon hydrides, are compounds containing a hydrogen-silicon bond. Compounds which include only silicon-carbon bonds, i.e. where all hydrogens have been replaced by alkyl, aryl or aralkyl substituents are also referred to occasionally, and herein, as silanes.

The properties of organosilanes are determined largely by the properties of the silicon atom which is larger than the carbon atom, enabling nucleophilic attack on the silicon to occur more readily than on carbon. Electrophilic attack on hydrogen bonded to silicon is also facilitated by the small steric constraints of hydrogen and the increased bond length for Si—H. In addition to the increased bond length, the Si—H bond energy is considerably lower than C—H and is reflected in the thermal stabilities of such bonds. Organohydrosilanes begin to decompose at 440°–460° C. through homolytic cleavage of the Si—H bond and subsequent radical formation.

Organohydrosilanes undergo a wide variety of chemical conversions. The Si—H bond of organohydrosilanes reacts with elements of most groups of the periodic system. Organosilanes, the simplest of which is methylsilane, are stable to air. The larger-chain alkylsilanes are more stable but ignite spontaneously when vaporized in oxygen under pressure. Phenyl and cyclohexylsilane can be distilled open to the atmosphere. Trialkyl- and triarylsilanes are more stable and have been distilled at as much as 325° C. without decomposition.

Alkylation and arylation of organosilanes occur readily with alkyl and aryl alkalimetal compounds with good yields, especially in tetrahydrofuran and ethyl ether according to the general reaction:

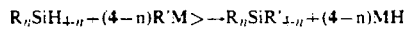

$$R_n SiH_{4-n} + (4-n)R'M \rightarrow R_n SiR'_{4-n} + (4-n)MH$$

where R and R' are alkyl, aryl or aralkyl and M is Li, Na, or K and n = 1 to 4.

A large variety of "thin films" are used in the fabrication of Very Large Scale Integration (VLSI) devices. These films may be thermally grown or deposited from the vapor phase. They can be metals, semiconductors, or insulators.

Thin films for use in VLSI fabrication must satisfy a large set of rigorous chemical, structural, and electrical requirements. Film composition and thickness must be strictly controlled to facilitate etching of submicron features. Very low densities of both particulate defects and film imperfections, such as pinholes, become critical for the small linewidths, high densities, and large areas necessary for VLSI. These small geometries also create highly rugged topography for overlying films to cover. Therefore, excellent adhesion, low stress, and conformal step coverage are required of a VLSI thin film, and its own surface topography should reduce or even planarize the underlying steps if possible.

Although the properties of a bulk material may be well characterized, the same material in its thin film form may have properties substantially different from those of the bulk. One reason is that thin film properties are strongly influenced by surface properties, while in bulk materials this is not the case. The thin film, by its very definition has a substantially higher surface-to-volume ratio than does a bulk material. The structure of thin films, and their method of preparation also play a vital role in determining the film properties.

The formation of such films is accomplished by a large variety of techniques, but which can conceptually be divided into two groups: (1) film growth by interaction of a vapor-deposited species with the substrate; and (2) film formation by deposition without causing changes to the substrate material.

Chemical vapor deposition, or CVD, in which solid films are formed on a substrate by the chemical reaction of vapor phase chemicals that contain the required constituents; (b) physical vapor deposition, or PVD, in which the species of the thin film are physically dislodged from a source to form a vapor which is transported across a reduced pressure region to the substrate, where it condenses to form the thin film; and (c) coating of the substrate with a liquid, which is then dried to form the solid thin film. When CVD process are used to form single-crystal thin films, the process is termed epitaxy. The formation of thin films by PVD includes the processes of sputtering and evaporation.

Thin film generally have smaller grain size than do bulk materials. Grain size is a function of the deposition conditions and annealing temperatures. Larger grains are observed for increased film thickness, with the effect increasing with increasing substrate or deposition temperature. The initial deposition temperature plays an important role in determining the final grain size. The dependence on deposition rate is due to the fact that even if clusters have high mobility, at high deposition rate they are quickly buried under subsequent layers. For very high deposition rates, the heat of condensation can raise the substrate temperature, thereby producing increased grain size from thermal effects.

The surface roughness of films occurs as a result of the randomness of the deposition process. Real films almost always show surface roughness, even though this represents a higher energy state than that of a perfectly flat film. Depositions at high temperatures tend to show less surface roughness. This is because increased surface mobility from the higher substrate temperatures can lead to filling of the peaks and valleys. On the other hand, higher temperatures can also lead to the development of crystal facets, which may continue to grow in favored directions, leading the increased surface roughness. At low temperatures the surface roughness as measured by surface area, tends to increase with increased film thickness. Oblique deposition which results in shadowing, also increases surface roughness. Epitaxial and amorphous deposits have shown measured surface area nearly equal to the geometrical area, implying the existence of very flat films. This has been confirmed by Scanning Electron Micrography (SEM) examination of these films. Surface roughness has also been observed to increase as a result of the presence of contamination on the substrate or in the vapor phase during deposition.

The density of a thin film provides information about its physical structure. Density is usually determined by weighing the film and measuring its volume. If a film is porous from the deposition process, it generally has a lower density than bulk material.

The single crystal substrate is the dominant factor in epitaxy. Some crystal symmetry must exist between the deposit and the substrate, and the lattice parameters of each material must be close to the same value. The lattice misfit, which is the percentage difference between the lattice constant of the deposit and that of the substrate plane in contact, must be small to achieve epitaxy. The deposition temperature also plays a role in epitaxy. Elevated temperatures increase the propensity for epitaxial growth. This is engendered by several mechanism, including: cleaner surfaces; decreased supersaturation; and increased adatom energy.

The deposition rate also plays a role in epitaxy. Lower rates tend toward epitaxy, while higher deposition rates lead to polycrystalline or amorphous deposition. Three growth regimes are observed for the deposition of Si on a clean Si substrate: (a) at low temperature and high deposition rates the deposits are amorphous; (b) at high substrate temperatures and low rate deposition they tend to be single crystal; and (c) at intermediate conditions polycrystalline films tend to form.

Nearly all films are found to be in a state of internal stress, regardless of the means by which they have been produced. The stress may be compressive or tensile. Compressively stressed films would like to expand parallel to the substrate surface, and in the extreme, films in compressive stress will buckle up on the substrate. Films in tensile stress, on the other hand, would like to contract parallel to the substrate, and may crack if their elastic limits are exceeded. In general, the stresses in thin films are in the range of $10^8 - 5 \times 10^{10}$ dynes/cm$^2$. Highly stressed films are generally undesirable for VLSI applications for several reasons, including: (a) they are more likely to exhibit poor adhesion; (b) they are more susceptible to corrosion; (c) brittle films, such as inorganic dielectrics, may undergo cracking in tensile stress; and (d) the resistivity of stressed metallic films is higher than that of their annealed counterparts.

The intrinsic stress reflects the film structure in ways not yet completely understood. It has been observed that the intrinsic stress in a film depends on thickness, deposition rate, deposition temperature, ambient pressure, method of film preparation, and type of substrate used, among other parameters.

At low substrate temperatures, metal films tend to exhibit tensile stress. This decreases with increasing substrate temperature, often in a linear manner, finally going through zero or even becoming compressive. The changeover to compressive stress occurs at lower temperatures for lower melting point metals.

The effect of deposition rate on film stress is ambiguous. The film stress starts out tensile, decreases as the power increases, and finally becomes compressive with further power increase.

A Chemical Vapor Deposition (CVD) process can be summarized as consisting of the following sequence of steps: (a) a given composition and flow rate of reactant gases and diluent inert gases is introduced into a reaction chamber; (b) the gas species move to the substrate; (c) the reactants are absorbed on the substrate; (d) the adatoms undergo migration and film-forming chemical reactions, and (e) the gaseous by-products of the reaction are desorbed and removed from the reaction chamber. Energy to drive the reactions can be supplied by several methods, e.g. thermal, photons, or electrons, with thermal energy being the most commonly used.

In practice, the chemical reactions of the reactant gases leading to the formation of a solid material may take place not only on or very close to the wafer surface, a heterogeneous reaction, but also in the gas phase, a homogeneous reaction. Heterogeneous reactions are much more desirable, as such reactions occur selectively only on heated surfaces, and produce good quality films. Homogeneous reactions, on the other hand, are undesirable, as they form gas phase clusters of the depositing material, which can result in poorly adhering, low density films, or defects in the depositing film. In addition, such reactions also consume reactants and can cause decreases in deposition rates. Thus, one important characteristic of a chemical reaction for CVD application is the degree to which heterogeneous reactions are favored over gas phase reactions.

Since the aforementioned steps of a CVD process are sequential, the one which occurs at the slowest rate will determine the rate of deposition. The steps can be grouped into (1) gas-phase processes, and (2) surface processes. The gas phase phenomenon of interest is the rate at which gases impinge on the substrate. This is modeled by the rate at which gases cross the boundary layer that separates the bulk regions of flowing gas and substrate surface. Such transport processes occur by gas-phase diffusion, which is proportional to the diffusivity of the gas, D, and concentration gradient across the boundary layer. The rate of mass transport is only relatively weakly influenced by temperature.

Several surface processes can be important once the gases arrive at the hot substrate surface, but the surface reaction, in general, can be modeled by a thermally activated phenomenon which proceeds at a rate which is a function of the frequency factor, the activation energy, and the temperature. The surface reaction rate increases with increasing temperature. For a given surface reaction, the temperature may rise high enough so that the reaction rate exceeds the rate at which reactant species arrive at the surface. In such cases, the reaction cannot proceed any more rapidly than the rate at which reactant gases are supplied to the substrate by mass transport, no matter how high the temperature is increased. This situation is referred to as a mass-transport limited deposition process.

On the other hand, at lower temperatures, the surface reaction rate is reduced, and eventually the arrival rate of reactants exceeds the rate at which they are consumed by the surface reaction process. Under such conditions the deposition rate is reaction rate limited. Thus, at high temperatures, the deposition is usually mass-transport limited, while at lower temperatures it is surface-reaction rate-limited. In actual processes the temperature at which the deposition condition moves from one of these growth regimes to the other is dependent on the activation energy of the reaction, and the gas flow conditions in the reactor. Thus, it is impossible to extrapolate with any certainty or accuracy date or process conditions or results from one pressure regime or temperature regime to another.

In processes that are run under reaction rate-limited conditions, the temperature of the process is an important parameter. That is, uniform deposition rates throughout a reactor require conditions that maintain a constant reaction rate. This in turn implies that a constant temperature must also exist everywhere at all wafer surfaces. On the other hand, under such conditions the rate at which reactant species arrive at the surface is not as important, since their concentration does not limit the growth rate. Thus, it is not as critical that a reactor be designed to supply an equal flux of reactants to all locations of a wafer surface. It will be seen that in low-pressure CVD (LPCVD) reactors, wafers can be stacked vertically and at very close spacing because such systems operate in a reaction rate limited mode. The reason for this is as follows:

Under the low pressure of an LPCVD reactor ~1 torr the diffusivity of the gas species is increased by a factor of 1000 over that at atmospheric pressure, and this is only partially offset by the fact that the boundary layer, the distance across which the reactants must diffuse, increases by less than the square root of the pressure. The net effect is that there is more than an order of magnitude increase in the transport of reactants to and by-products away from the substrate surface, and the rate-limiting step is thus the surface reaction.

In deposition processes that are mass-transport limited, however, the temperature control is not nearly as critical. As mentioned earlier, the mass transport process which limits the growth rate is only weakly dependent on temperature. On the other hand, it is very important that the same concentration of reactants be present in the bulk gas regions adjacent to all locations of a wafer, as the arrival rate is directly proportional to the concentration in the bulk gas. Thus, to insure films of uniform thickness across a wafer, reactors which are operated in the mass transport limited regime must be designed so that all locations of wafer surfaces and all wafers in a run are supplied with an equal flux of reactant species. Atmospheric pressure reactors that deposit $SiO_2$ at ~400° C. operate in the mass-transport limited regime. The most widely used APCVD reactor designs provide a uniform supply of reactants by horizontally positioning the wafer and moving them under a gas stream.

Low pressure chemical vapor deposition (LPCVD) in some cases is able to overcome the uniformity, step coverage, and particulate contamination limitations of early APCVD systems. By operating at medium vacuum, 30–250 Pa or 0.25–2.0 torr, and higher temperatures, 550°–600° C., LPCVD reactors typically deposit films in the reaction rate limited regime. At reduced pressure the diffusivity of the reactant gas molecules is sufficiently increased so that mass-transfer to the substrate no longer limits the growth rate. The surface reaction rate is very sensitive to temperature, but precise temperature control is relatively easy to achieve. The elimination of mass-transfer constraints on reactor design allows the reactor to be optimized for high wafer capacity. Low pressure operation also decreases gas phase reactions, making LPCVD films less subject to particulate contamination. LPCVD is used for depositing many types of films, including poly-Si, $Si_3N_4$, $SiO_2$, PSG, BPSG, and W.

The two main disadvantages of LPCVD are the relatively low deposition rates, and the relatively high operating temperatures. Attempting to increase deposition rates by increasing the reactant partial pressures, tends to initiate gas phase reactions. Attempting to operate at lower temperatures, results in unacceptably slow film deposition. One of the features of the present invention is the discovery that by using selected deposition source reagents, rather than methyl-containing reagents and the like which have been traditional, greatly increased deposition rates can be accomplished without the deleterious reactions and poor results which have plagued the industry for so many years.

LPCVD reactors are designed in two primary configurations: (a) horizontal tube reactors; and (b) vertical flow isothermal reactors.

Horizontal tube, hot wall reactors are the most widely used LPCVD reactors in VLSI processing. They are employed for depositing poly-Si, silicon nitride, and undoped and doped $SiO_2$ films. They find such broad applicability primarily because of their superior economy, throughput, uniformity, and ability to accommodate large diameter, e.g. 150 mm wafers. Their main disadvantages are susceptibility to particulate contamination and low deposition rates.

The vertical flow isothermal LPCVD reactor further extends the distributed gas feed technique, so that each wafer receives an identical supply of fresh reactants. Wafers are again stacked side by side, but are placed in perforated-quartz cages. The cages are positioned beneath long, perforated, quartz reaction-gas injector tubes, one tube for each reactant gas. Gas flows vertically from the injector tubes, through the cage perforations, past the wafers, parallel to the wafer surface and into exhaust slots below the cage. The size, number, and location of cage perforations are used to control the flow of reactant gases to the wafer surfaces. By properly optimizing cage perforation design, each wafer can be supplied with identical quantities of fresh reactants from the vertically adjacent injector tubes. Thus, this design can avoid the wafer-to-wafer reactant depletion effects of the end-feed tube reactors, requires no temperature ramping, produces highly uniform depositions, and reportedly achieves low particulate contamination.

The third and last of the major CVD deposition methods is categorized not only by pressure regime, but also by its method of energy input. Rather than relying solely on thermal energy to initiate and sustain chemical reactions, plasma enhanced CVD, or PECVD uses an rf-induced glow discharge to transfer energy into the reactant gases, allowing the substrate to remain at a lower temperature than in APCVD or LPCVD processes. Lower substrate temperature is the major advantage of PECVD, and in fact, PECVD provides a method of depositing films on substrates that do not have the thermal stability to accept coating by other methods, the most important being the formation of silicon nitride and $SiO_2$ over metals. In addition, PECVD can enhance the deposition rate when compared to thermal reactions alone, and produce films of unique compositions and properties. Desirable properties such as good adhesion, low pinhole density, good step coverage, adequate electrical properties, and compatibility with fine-line pattern transfer processes, have led to application of these films in VLSI.

The plasma, which is defined as a partially ionized gas containing an equal number of positive and negative charges, as well as some other number of non-ionized gas particles, is generated by the application of a radio frequency field to a low pressure gas, thereby creating free electrons within the discharge region. The electrons gain sufficient energy from the electric field so that when they collide with gas molecules, gas-phase dissociation and ionization of the reactant gases, e.g. silane and nitrogen or oxygen-containing species then occurs.

The energetic particles used to strike target materials to be sputtered in VLSI sputter deposition systems are generated by glow-discharges. A glow-discharge is a self-sustaining type of plasma.

The energetic species are then adsorbed on the film surface. The radicals tend to have high sticking coefficients, and also appear to migrate easily along the surface after adsorption. These two factors can lead to excellent film conformality. Upon being adsorbed on the substrate, they are subjected to ion and electron bombardment, rearrangements, reactions with other adsorbed species, new bond formations and film formation and growth. Adatom rearrangement includes the diffusion of the adsorbed atoms onto stable sites and concurrent desorption of reaction products. Desorption rates are dependent on substrate temperature, and higher temperatures produce films with fewer entrapped by-products. Gas-phase nucleation should be avoided to reduce particulate contamination.

The fact that the radicals formed in the plasma discharge are highly reactive presents some options, as well as some problems, to the process engineer. PECVD films, in general, are not stoichiometric because the deposition reactions are so varied and complicated. Moreover, by-products and incidental species are incorporated into the resultant films, especially hydrogen, nitrogen, and oxygen, in addition to the desired products. Excessive incorporation of these contaminants may lead to outgassing and concomitant bubbling, cracking, or peeling during later thermal cycling, and to threshold shifts in MOS circuits.

A plasma process requires control and optimization of several deposition parameters besides those of an LPCVD process, including rf power density, frequency, and duty cycle. The deposition process is dependent in a very complex and interdependent way on these parameters, as well as on the usual parameters of gas composition, flow rates, temperature, and pressure. Furthermore, as with LPCVD, the PECVD method is surface reaction limited, and adequate substrate temperature control is thus necessary to ensure film thickness uniformity.

Three types of PECVD reactors are available: (1) the parallel plate type; (2) the horizontal tube type; and (3) the single wafer type. It should be noted that with one major exception, the discussion on glow discharges, rf diode sputtering, and rf generated plasmas for dry etching applies to the production of rf generated plasma in PECVD reactors.

Many treatises, texts and a massive volume of technical journal literature describe in more detail the background of the technology in which this invention lies; see, for example, Thomas, HANDBOOK OF TRANSISTORS, SEMICONDUCTORS, INSTRUMENTS AND MICROELECTRONICS, Prentice Hall, Englewood Cliffs, N.J. 1968.

Nelson, U.S. Pat. No. 4,158,717 reviews the state of the art of producing silicon nitride films and describes the production silicon nitride films as protective and anti-reflective coatings and for masking semiconductive devices by a plasma discharge in azidotrimethylsilane, $(CH_3)_3SiN_3$, pointing out that azidotrimethylsilane is easier to handle than silane.

Matsuda et al, U.S. Pat. No. 4,569,855, discloses the use of azidosilanes in a very low temperature (50°–150° C.) high energy light activated gas deposition process for forming silicon and doped silicon films. While reference is made to alkyl, aryl and alkoxy azidosilanes, there is no specific disclosure of the use of ethyl, propyl, or butyl azidosilanes, or to higher-carbon alkyl, aryl or alkoxy azidosilanes in the Matsuda et al patent. Matsuda et al speculate that thermal energy deposition of $SiH_4$ or $Si_2H_6$ result in Si films with poor characteristics, and teach that this difficulty can be overcome using high energy activation, i.e. photoactivation, for decomposing the gas to form a film. One would predict from Matsuda et al that thermalactivation method at higher temperatures would not be suitable for forming Si films.

SUMMARY OF THE INVENTION

The present invention is low temperature chemical vapor deposition process for preparing silicon films having a sheet resistance of approximately $1 \times 10^3$ Ω/square. The process is carried out by heating in a chemical vapor deposition reactor a substrate upon which deposition is desired to a temperature of from about 550° C. to about 750° C. While heating the substrate, the reactor pressure is maintained at from about 0.1 torr to about 1 atmosphere and a volatile silicon-containing feed is introduced into the reactor. The silicon containing feed consists essentially of one or more compounds having the general formula.

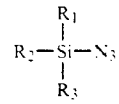

wherein: $R_1$, $R_2$, and $R_3$ are hydrogen, azido or 1 to 6 carbon alkyl, phenyl or 7 to 10 carbon alkaryl groups, at least one of $R_1$, $R_2$, and $R_3$, being 1 to 6 carbon alkyl, phenyl or 7 to 10 carbon alkaryl. The temperature and pressure are maintained using the silicon containing feed to cause a film of silicon to deposit on substrate. In a preferred embodiment, the silicon containing feed consists essentially of ethyltriazidosilane or diethyldiazidosilane, and the temperature range is above about 560° C.

The chemical vapor deposition process of this invention comprises the steps of: (a) heating in a chemical vapor deposition reactor a substrate upon which deposition is desired to a temperature of from above about 560° C.; (b) establishing in the chemical vapor deposition reactor a pressure of from approximately 1±0.9 torr to approximately atmospheric pressure and maintaining such pressure during the process; (c) introducing an alkylazidosilane or an aralkylazidosilane wherein the alkyl-, aryl-or aralkyl- moiety comprises from 1–6 carbon alkyl, phenyl or 7 to 10 carbon alkaryl, and (d) maintaining the temperature and pressure in said ranges cause a film of silicon having a sheet resistance of approximately $1 \times 10^3$ Ω/square to deposit on said substrate. Preferably, the reaction is carried out in a vacuum having a pressure of from about 0.1 to about 1.5 torr. The reagents may be activated by plasma, ion beam, electron beam or laser energy to enhance chemical vapor deposition.

DESCRIPTION OF THE PREFERRED EMBODIMENT

The process of this invention is carried out in a vacuum in the general range of from approximately 0.1 torr to about atmospheric pressure, preferably from about 0.1 torr to about 1.9 torr, and, most efficiently with best results, in a pressure range of from about 0.1 to 1 torr, and in a temperature range of from about 525°–550° C. at the low end of the range to about 750° C. at the high end of the range, the optimum temperature range being a function of the silicon feed stock composition but generally from about 560° C. to 750° C.

The process of the present invention is carried out under LPCVD process conditions, varied as described, with a volatile silicon-containing feed consisting essentially of compounds having the general formula

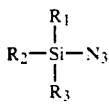

wherein: $R_1$, $R_2$, and $R_3$ are hydrogen, azido, or 1 to 6 carbon alkyl, aryl, phenyl or 7 to 10 carbon aralkyl groups, at least one of $R_1$, $R_2$, and $R_3$ being 1 to 6 carbon alkyl, phenyl, or 7 to 10 carbon alkaryl. Ethyltriazidosilane, diethyldiazidosilane and triethylazidosilane are the preferred compounds for use in this invention.

The preferred process of this invention is carried out using the well established LPCVD technology, modified by the process conditions mentioned above and discussed hereinafter. The purpose of the discussion and examples is to disclose the preferred embodiment in such terms as will enable the art to practice the invention, and not as a limitation upon the scope of the invention.

A typical reaction is carried out in a 150 mm hot-wall LPCVD horizontal tube reactor, though the apparatus configuration is not critical, using, preferably pressures in the general range of about 1±0.9 torr, but pressures as high as approximately atmospheric or somewhat higher may be employed, using, for example, 100 mm Si wafers, with an azidosilane feed rate of from about 0.05 to 2 gm/min, typically about 0.5 gm/min.

It is of great importance that the reagents be free of oxygen, i.e. the oxygen contamination must be so low as to prevent the formation of any significant amount of silicon oxides when the process is carried out.

Atmospheric pressure chemical vapor deposition and plasma, ion beam, electron beam and laser enhanced chemical vapor deposition techniques may also be used to carry out the invention.

The following examples illustrate, but do not limit, the concept or scope of the invention.

EXAMPLE 1

ETHYLTRIAZIDOSILANE—SILICON

The process as described was carried out using ethyltriazidosilane as the Si-containing feed stock at a rate of 0.2 gm/min at 577° C. resulting in silicon film at a deposition rate of just under 100 Å per minute. The film constitution was determined by energy dispersive x-ray analysis and ellipsometry. The sheet resistance of the films, as measured by the 4-point probe method, was approximately $1 \times 10^3$ Ω/square.

These reagents are liquid and more easily and safely handled than silane, the conventional reagent of the prior art. The compounds of this invention also have higher vapor pressures than the alkoxysilanes and flow rates are more easily controlled using known mass flow controllers and control methods than the alkoxysilanes and yet avoid the hazards of the silanes.

INDUSTRIAL APPLICATION

The greatest industrial application of this invention is in the manufacture of semiconductor devices; however, the discoveries of this invention are applicable to any thin film deposition of Silicon.

What is claimed is:

1. A low temperature chemical vapor deposition process for preparing silicon films having a sheet resistance of approximately $1 \times 10^3$ Ω/square comprising the steps of:

heating in a chemical vapor deposition reactor a substrate upon which deposition is desired to a temperature of from about 550° C. to about 750° C.;

maintaining in the reactor a pressure of from about 0.1 torr to about 1 atmosphere during the process;

introducing into the reactor a volatile silicon-containing feed, said silicon containing feed consisting essentially of one or more compounds having the general formula

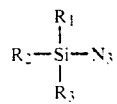

wherein: $R_1$, $R_2$, and $R_3$ are hydrogen, azido or 1 to 6 carbon alkyl, phenyl or 7 to 10 carbon alkaryl groups, at least one of $R_1$, $R_2$, and $R_3$, being 1 to 6 carbon alkyl, phenyl or 7 to 10 carbon alkaryl, and maintaining the temperature and pressure in said ranges to cause a film of silicon to deposit on said substrate.

2. The process of claim 1 wherein the silicon containing feed consists essentially of ethyltriazidosilane and the temperature range is above about 560° C.

3. The process of claim 1 wherein the azidosilane is diethyldiazidosilane.

4. The process of claim 1 wherein the azidosilane is triethylazidosilane.

5. A chemical vapor deposition process comprising the steps of:

heating in a chemical vapor deposition reactor a substrate upon which deposition is desired to a temperature of from above about 560° C.;

establishing in the chemical vapor deposition reactor a pressure of from approximately 1±0.9 torr to approximately atmospheric pressure and maintaining such pressure during the process;

introducing an alkylazidosilane or an aralkylazidosilane wherein the alkyl-, aryl- or aralkyl- moiety comprises from 1–6 carbon alkyl, phenyl or 7 to 10 carbon alkaryl; and maintaining the temperature and pressure in said ranges cause a film of silicon having a sheet resistance of approximately $1 \times 10^3$ Ω/square to deposit on said substrate.

6. The process of claim 5 wherein the reaction is carried out in a vacuum having a pressure of from about 0.1 to about 1.5 torr.

7. The process of claim 6 further comprising activating the reagents in the vicinity of the substrate by plasma, ion beam, electron beam or laser energy to enhance chemical vapor deposition.

8. The process of claim 5 wherein the reaction is carried out in a vacuum having a pressure of approximately one torr.

9. The process of claim 5 further comprising activating the reagents in the vicinity of the substrate by plasma, ion beam, electron beam or laser energy to enhance chemical vapor deposition.

* * * * *